(12) United States Patent
Kajisa

(10) Patent No.: US 10,681,831 B2
(45) Date of Patent: Jun. 9, 2020

(54) ELECTRONIC COMPONENT MOUNTING BOARD, ELECTRONIC DEVICE, AND ELECTRONIC MODULE

(71) Applicant: KYOCERA Corporation, Kyoto-shi, Kyoto (JP)

(72) Inventor: Sadamu Kajisa, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/987,967

(22) Filed: May 24, 2018

(65) Prior Publication Data
US 2019/0008064 A1 Jan. 3, 2019

(30) Foreign Application Priority Data
Jun. 28, 2017 (JP) .................................. 2017-126213

(51) Int. Cl.
| | |
|---|---|
| *H05K 13/00* | (2006.01) |
| *H01L 27/146* | (2006.01) |
| *H05K 5/03* | (2006.01) |
| *H05K 13/04* | (2006.01) |
| *H05K 7/06* | (2006.01) |
| *H01L 27/148* | (2006.01) |

(Continued)

(52) U.S. Cl.
CPC ............. *H05K 7/06* (2013.01); *H01L 27/148* (2013.01); *H01L 27/14643* (2013.01); *H05K 1/183* (2013.01); *H05K 5/03* (2013.01); *H05K 13/00* (2013.01); *H05K 13/0469* (2013.01); *H01L 2224/48091* (2013.01); *H01L 2224/48227* (2013.01); *H01L 2224/49175* (2013.01); *H05K 1/0271* (2013.01); *H05K 3/4629* (2013.01); *H05K 2201/10106* (2013.01); *H05K 2201/10121* (2013.01)

(58) Field of Classification Search
CPC ...... H05K 7/06; H05K 13/00; H05K 13/0469; H05K 1/183; H05K 5/03; H05K 2201/10106; H01L 27/14643; H01L 27/148
See application file for complete search history.

(56) References Cited

U.S. PATENT DOCUMENTS 9,680,078 B2 * 6/2017 Nakabayashi ......... H05K 3/282
9,974,185 B2 * 5/2018 Tago .................... H05K 1/0298
(Continued)

FOREIGN PATENT DOCUMENTS

JP 2004-031601 A 1/2004

*Primary Examiner* — Rockshana D Chowdhury
(74) *Attorney, Agent, or Firm* — Volpe and Koenig, P.C.

(57) ABSTRACT

An electronic component mounting board includes a substrate and a metal layer. The substrate includes a first layer, and a second layer located at a lower surface of the first layer. The metal layer is located between the first layer and the second layer, and includes a first conductor layer, and a second conductor layer located with a space from the first conductor layer. The space extends from a first end of the metal layer to a second end of the metal layer different from the first end as viewed from above. The metal layer overlaps a first imaginary line that is parallel to one side of the substrate and passes through a center of the substrate, and a second imaginary line that is perpendicular to the first imaginary line and passes through the center of the substrate as viewed from above.

20 Claims, 12 Drawing Sheets

(51) Int. Cl.
*H05K 1/18* (2006.01)
*H05K 1/02* (2006.01)
*H05K 3/46* (2006.01)

(56) References Cited

U.S. PATENT DOCUMENTS

| | | | | |
|---|---|---|---|---|
| 2013/0213699 A1* | 8/2013 | Chisaka | ................ | H05K 1/186 |
| | | | | 174/255 |
| 2015/0280082 A1* | 10/2015 | Amo | ...................... | H01L 33/52 |
| | | | | 257/98 |
| 2015/0380607 A1* | 12/2015 | Wu | ........................ | H01L 33/08 |
| | | | | 257/89 |

* cited by examiner

ELECTRONIC COMPONENT MOUNTING BOARD, ELECTRONIC DEVICE, AND ELECTRONIC MODULE

BACKGROUND

1. Technical Field

The present invention relates to an electronic component mounting board on which an electronic component, such as an imaging device including a charge-coupled device (CCD) or a complementary metal oxide semiconductor (CMOS) device, a light-emitting device including a light emitting diode (LED), and an integrated circuit, is mounted, and to an electronic device and an electronic module.

2. Description of the Background

An electronic component mounting board including a wiring board formed from insulating layers is known. An electronic device incorporating such an electronic component mounting board and an electronic component mounted on the mounting board is also known (refer to Japanese Unexamined Patent Application Publication No. 2004-031601).

The electronic component mounting board described in Japanese Unexamined Patent Application Publication No. 2004-031601 includes inner wires between multiple insulating layers. A single layer includes multiple inner wires that are spaced from one another. Electronic component mounting boards have typically become thinner and include thinner insulating layers. A thinner electronic component mounting board may have stress concentration between its multiple inner wires during handling or under external stress or external vibrations, and can have a lower strength.

BRIEF SUMMARY

An electronic component mounting board according to one aspect of the present invention includes a substrate and a metal layer. The substrate includes a first layer, and a second layer located at a lower surface of the first layer. The electronic component mounting board includes the metal layer, which is located between the first layer and the second layer. The metal layer includes a first conductor layer, and a second conductor layer located with a space from the first conductor layer. The space extends from a first end of the metal layer to a second end of the metal layer different from the first end as viewed from above. The metal layer overlaps a first imaginary line that is parallel to one side of the substrate and passes through a center of the substrate, and a second imaginary line that is perpendicular to the first imaginary line and passes through the center of the substrate as viewed from above.

An electronic component mounting board according to another aspect of the present invention includes a quadrangular substrate and a metal layer. The substrate includes a first layer, and a second layer located at a lower surface of the first layer, and a first area having a recess in which an electronic component is mountable, and a second area adjacent to the first area as viewed from above. The first area or the second area includes the metal layer, which is located between the first layer and the second layer. The metal layer includes a first conductor layer, and a second conductor layer located with a space from the first conductor layer. The space between the first conductor layer and the second conductor layer extends from a first end of the metal layer to a second end of the metal layer different from the first end as viewed from above. The metal layer overlaps a first imaginary line that is parallel to one side of the substrate and passes through a center of the first area or the second area, and a second imaginary line that is perpendicular to the first imaginary line and passes through the center of the first area or the second area as viewed from above.

An electronic device according to another aspect of the present invention includes an electronic component mounting board, and an electronic component mounted on the electronic component mounting board.

An electronic module according to still another aspect of the present invention includes a housing located on an upper surface of an electronic device or covering an electronic device.

DETAILED DESCRIPTION

Structures of Electronic Component Mounting Board and Electronic Device

Embodiments of the present invention will now be described by way of example with reference to the drawings. In the embodiments described below, an electronic device includes an electronic component mounted on an electronic component mounting board. An electronic module includes a housing or a member located at the upper surface of the electronic component mounting board or covering the electronic device. Although the electronic component mounting board, the electronic device, and the electronic module may be arranged to have any of their faces upward or downward, they are herein defined using the orthogonal xyz coordinate system with the positive z direction upward for ease of explanation.

First Embodiment

Figure 1A:
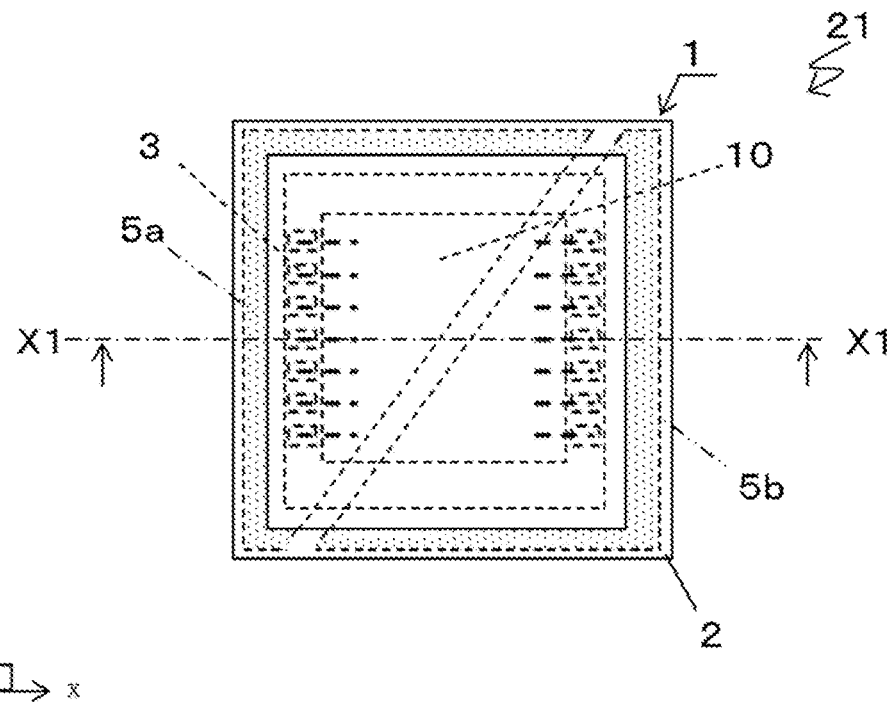
FIG. 1A is an external top view of an electronic component mounting board and an electronic device according to a first embodiment of the present invention.
Figure 1B:
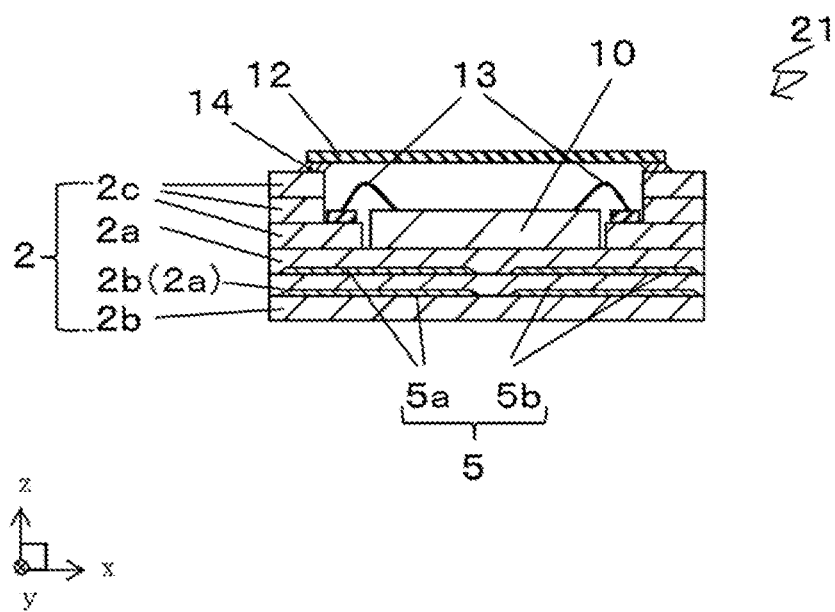
FIG. 1B is a cross-sectional view taken along line X1-X1 in FIG. 1A.
Figure 2A:
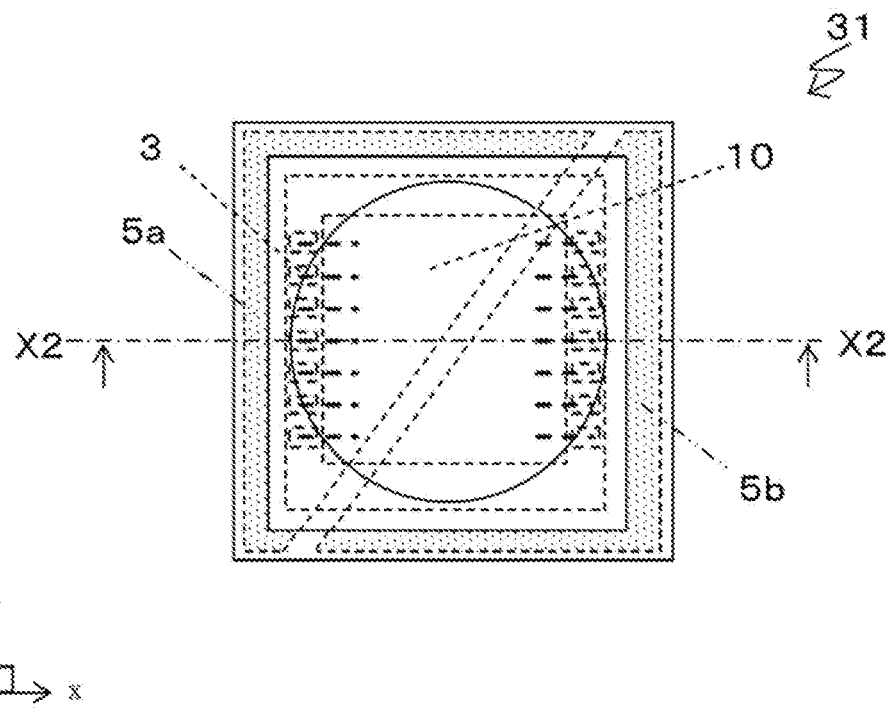
FIG. 2A is an external top view of an electronic module according to the first embodiment of the present invention.
Figure 2B:
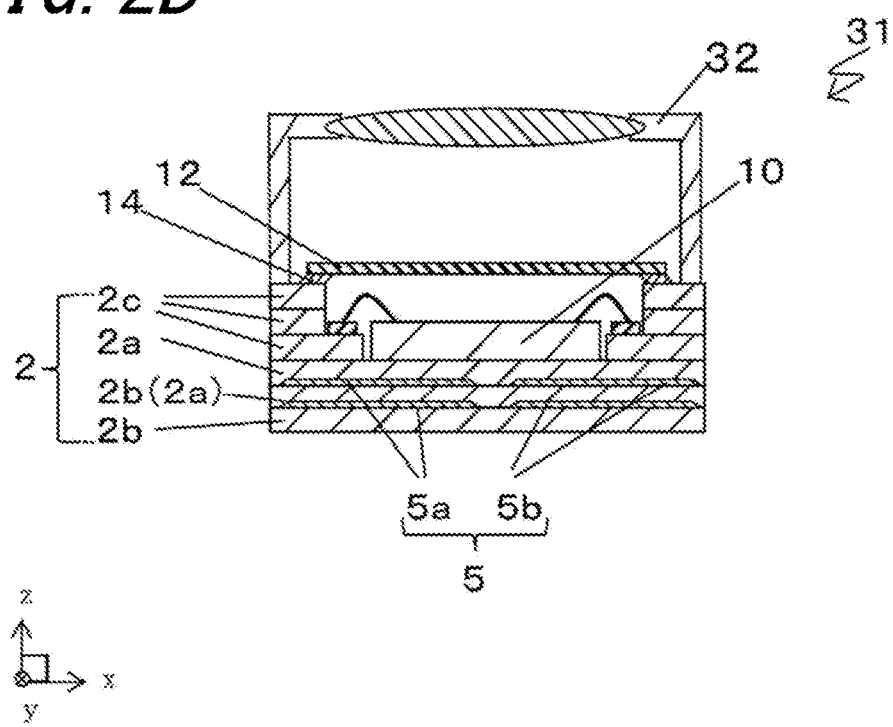
FIG. 2B is a cross-sectional view taken along line X2-X2 in FIG. 2A.

An electronic module 31, an electronic device 21, and an electronic component mounting board 1 according to a first embodiment of the present invention will be described with reference to FIGS. 1A to 4B. An inner layer in the electronic component mounting board 1 according to the first embodiment of the present invention will be described with reference to FIGS. 3A to 4B. The electronic device 21 according to the present embodiment includes the electronic component mounting board 1 and an electronic component 10. In the present embodiment, FIGS. 1A and 1B show the electronic device 21, FIGS. 2A and 2B show the electronic module 31, and FIGS. 3A to 4B show the inner layer included in the electronic component mounting board 1. In FIGS. 1A to 4B, a metal layer 5 (a first conductor layer 5a and a second conductor layer 5b) is indicated by dots and solid lines. In FIGS. 3A to 4B, a first imaginary line α1 and a second imaginary line α2 are drawn with two-dot chain two-dot chain lines.

The electronic component mounting board 1 includes a quadrangular substrate 2, on which the electronic component 10 is mountable. The substrate 2 includes a first layer 2a, and a second layer 2b located at the lower surface of the first layer 2a. The substrate 2 includes a metal layer 5 between the first layer 2a and the second layer 2b. The metal layer 5 includes a first conductor layer 5a and a second conductor layer 5b located with a space 7 from the first conductor layer 5a. The space 7 between the first conductor layer 5a and the second conductor layer 5b in the electronic component mounting board 1 extends from a first end 7a of the metal layer 5 to a second end 7b of the metal layer 5 different from the first end 7a as viewed from above. The metal layer 5 in the electronic component mounting board 1 overlaps the first imaginary line α1, which is parallel to one side of the substrate 2 and passes through a center 6 of the substrate 2, and the second imaginary line α2, which is perpendicular to the first imaginary line α1 and passes through the center 6 of the substrate 2 as viewed from above.

The electronic component mounting board 1 includes the quadrangular substrate 2, on which the electronic component 10 is mountable. Examples of the quadrangle include a square, a rectangle, a trapezoid, and a parallelogram as viewed from above. The quadrangle comprises at least two pairs of straight lines, or four straight lines, as its outer sides as viewed from above. The straight lines in one of the two pairs are parallel to each other. The quadrangle may have a corner with a curved notch, a corner with a largely removed part, or outer sides each having a notch or a cutout.

The substrate 2 includes the first layer 2a, and the second layer 2b located at the lower surface of the first layer 2a. As in the example shown in FIGS. 1A and 1B, the electronic component mounting board 1 may include an additional layer 2c, in addition to the first layer 2a and the second layer 2b. The above electronic component may be mounted on the upper or lower surface of the first layer 2a or the second layer 2b, or on the upper or lower surface of the additional layer 2c located at the upper surface of the first layer 2a or at the lower surface of the second layer 2b.

The insulating layers including the first layer 2a, the second layer 2b, and the additional layer 2c comprises, for example, an electrical insulating ceramic material or a resin such as a thermoplastic resin.

Examples of the electrical insulating ceramic material used for the insulating layers forming the first layer 2a, the second layer 2b, and the additional layer 2c include sintered aluminum oxide, sintered mullite, sintered silicon carbide, sintered aluminum nitride, sintered silicon nitride, and sintered glass ceramic. Examples of the resin used for the insulating layers forming the first layer 2a, the second layer 2b, and the additional layer 2c include a thermoplastic resin, an epoxy resin, a polyimide resin, an acryl resin, a phenolic resin, and a fluorine-based resin. Examples of the fluorine-based resin include a polyester resin and a polytetrafluoroethylene resin.

The substrate 2 may include multiple additional insulating layers 2c stacked on one another on the upper surface of the first layer 2a and/or on the lower surface of the second layer 2b. The substrate 2 including the first layer 2a, the second layer 2b, and the additional layers 2c may include six insulating layers as shown in FIG. 1B, or may include five or less, or seven or more insulating layers. The use of five or less layers reduces the thickness of the electronic component mounting board 1. The use of six or more layers increases the rigidity of the electronic component mounting board 1. As in the examples shown in FIGS. 1A to 2B, the insulating layers may have openings with different sizes. The openings may define a step, on which electrode pads 3 (described later) may be placed.

The electronic component mounting board 1 comprises an outermost perimeter with a length of, for example, 0.3 mm to 10 cm on one side, and may be rectangular or square when it is quadrangular as viewed from above. The electronic component mounting board 1 comprises a thickness of, for example, at least 0.2 mm.

The electronic component mounting board 1 includes the substrate 2, which includes the metal layer 5 between the first layer 2a and the second layer 2b. The metal layer 5 includes the first conductor layer 5a and the second conductor layer 5b located with the space 7 from the first conductor layer 5a. The substrate 2 in the electronic component mounting board 1 may include the electrode pads 3 on its surface. The electrode pads 3 herein may be arranged on the surface of at least one of the first layer 2a, the second layer 2b, and the additional layer 2c as viewed from above. The electrode pads 3 may thus be arranged on the surface of at least one of or each of the first layer 2a, the second layer 2b, and the additional layer 2c.

The substrate 2 may have electrodes for connection to external circuits on its upper surface, side surfaces, or lower surface. The electrodes for connection to external circuits electrically connect the substrate 2 or the electronic device 21 to external circuit boards.

In addition to the electrode pads 3, the first conductor layer 5a, and the second conductor layer 5b, the substrate 2 may also include inner wires between the insulating layers, and feedthrough conductors that vertically connect the inner wires on the upper surfaces or the lower surfaces of the first layer 2a, the second layer 2b, and the additional layer 2c. The inner wires or the feedthrough conductors may be uncovered on the surface of the substrate 2. The inner wires or the feedthrough conductors may electronically connect the electrode pads 3, the first conductor layer 5a, and the second conductor layer 5b to the electrodes for connection to external circuits.

When the first layer 2a, the second layer 2b, and the additional layer 2c are formed from an electrical insulating ceramic material, the electrode pads 3, the metal layer 5 (the first conductor layer 5a and the second conductor layer 5b), the electrodes for connection to external circuits, the inner wires, and the feedthrough conductors are formed from tungsten (W), molybdenum (Mo), manganese (Mn), silver (Ag), or copper (Cu), or an alloy containing one or more of these metals. When the first layer 2a, the second layer 2b, and the additional layer 2c are formed from a resin, the electrode pads 3, the metal layer 5 (the first conductor layer 5a and the second conductor layer 5b), the electrodes for connection to external circuits, the inner wires, and the feedthrough conductors are formed from copper (Cu), gold, (Au), aluminum (Al), nickel, (Ni), molybdenum (Mo), or titanium (Ti), or an alloy containing one or more of these metals.

The uncovered surfaces of the electrode pads 3, the electrodes for connection to external circuits, the inner wires, and the feedthrough conductors may be plated. The plating layer protects the uncovered surfaces of electrode pads 3, the electrodes for connection to external circuits, the inner wires, and the feedthrough conductors reduced oxidation. The plating layer also improves the electrical connection between the electrode pads 3 and the electronic component 10 with electronic component connections 13, such as wire bonding. The plating layer may be, for example, a Ni plating layer with a thickness of 0.5 to 10 μm, or this Ni plating layer may further be coated with a gold (Au) plating layer with a thickness of 0.5 to 3 μm.

The first conductor layer 5a and the second conductor layer 5b are separated by the space 7. The space 7 electrically insulates the first conductor layer 5a and the second conductor layer 5b from each other. The first conductor layer 5a and the second conductor layer 5b may have different potentials or signals or may have the same potential or signal, and may be electrically connected to another part, such as an upper layer or a lower layer. The space between the first conductor layer 5a and the second conductor layer 5b is, for example, at least 20 μm or at least 1% of one side of the substrate 2. The first conductor layer 5a and the second conductor layer 5b having different potentials or signals will not form a noise path, unlike those having a common potential, and thus can reduce noise generation. This structure also accommodates complicated wiring. When the space 7 is large, the wires are less likely to come in contact with one another. However, the larger space 7 can weaken the part of the substrate 2 without the metal layer 5 under a load applied when the electronic component 10 is mounted. In response to this, the metal layer 5 may extend to the weakened part to maintain the strength of the substrate 2, while achieving less contact between the wires.

The conductor layer 5a and the second conductor layer 5b may be thin wires, such as signal wires, or may be wide and flat wires to serve as a ground potential or a power potential. When the first conductor layer 5a and the second conductor layer 5b are wide and flat wires serving as a ground potential or a power potential, the substrate may include an additional signal wire, such as a signal wire, in the space 7 between the first conductor layer 5a and the second conductor layer 5b.

The electronic component mounting board 1 comprises the space 7 between the first conductor layer 5a and the second conductor layer 5b, which extends from the first end 7a of the metal layer 5 to the second end 7b of the metal layer 5 different from the first end 7a as viewed from above. In other words, the space 7 between the first conductor layer 5a and the second conductor layer 5b herein is a continuous area extending from one end to another end of the metal layer 5. The space 7 excludes, for example, a substantially circular clearance in the metal layer 5 for insulating the metal layer 5 from the feedthrough conductors. The first end 7a of the metal layer 5 and the second end 7b of the metal layer 5 different from the first end 7a may refer to the boundary point between the space 7 and the first conductor layer 5a or the boundary point between the space 7 and the second conductor layer 5b. In other words, each of the first end 7a and the second end 7b is one of the end points included in the boundary between the space 7 and the metal layer 5.

In the examples shown in FIGS. 3A to 4B, although the first end 7a and the second end 7b are located near the opposing sides of the metal layer 5, the ends may be located on adjacent sides at a right angle. In other words, the first end 7a and the second end 7b are not located on the same side but are located on any different sides of the metal layer 5.

The electronic component mounting board 1 includes the metal layer 5, which overlaps the first imaginary line α1 that is parallel to one side of the substrate 2 and passes through the center 6 of the substrate 2 as viewed from above. The metal layer 5 also overlaps the second imaginary line α2 that is perpendicular to the first imaginary line α1 and passes through the center 6 of the substrate 2 as viewed from above.

In response to this, the electronic component mounting board 1 according to one or more embodiments of the present invention described above comprises the space 7 between the first conductor layer 5a and the second conductor layer 5b that does not extend continuously and perpendicular to a pair of opposing sides of the substrate 2, and comprises the metal layer 5 located adjacent to the space 7 in the vertical and horizontal directions in the figures. The electronic component mounting board 1 with the metal layer 5 is more resistant to impact than the structure simply including insulating layers. This reduces the decrease in the strength of the electronic component mounting board 1 at the space 7 between the first conductor layer 5a and the second conductor layer 5b, and thus reduces cracks or breaks in the thinner electronic component mounting board 1.

FIGS. 3A to 4B are plan views of the structure according to the present embodiment showing an inner layer. The substrate 2 comprises substantially the center 6 that may deviate from its precise center by about 30 μm. The center 6 of the substrate 2 is, for example, an intersection of two imaginary diagonal lines of the quadrangular substrate 2 or an intersection of two imaginary lines that pass the midpoints of two pairs of opposing outer sides.

The metal layer 5 overlapping the first imaginary line α1 and the second imaginary line α2 as viewed from above specifically refers to the first imaginary line α1 and/or the second imaginary line α2 overlapping one or both of the first conductor layer 5a and the second conductor layer 5b. In the examples shown in FIGS. 3A and 3B, for example, each of the first conductor layer 5a and the second conductor layer 5b may overlap both the first imaginary line α1 and the second imaginary line α2. In the examples shown in FIG. 4B, one of the first conductor layer 5a and the second conductor layer 5b may overlap one of the first imaginary line α1 and the second imaginary line α2. The metal layer 5 may at least partially or peripherally overlap the first imaginary line α1 and the second imaginary line α2. The middle area of each of the first conductor layer 5a and the second conductor layer 5b may or may not overlap the first imaginary line α1 and the second imaginary line α2.

Figure 3A:
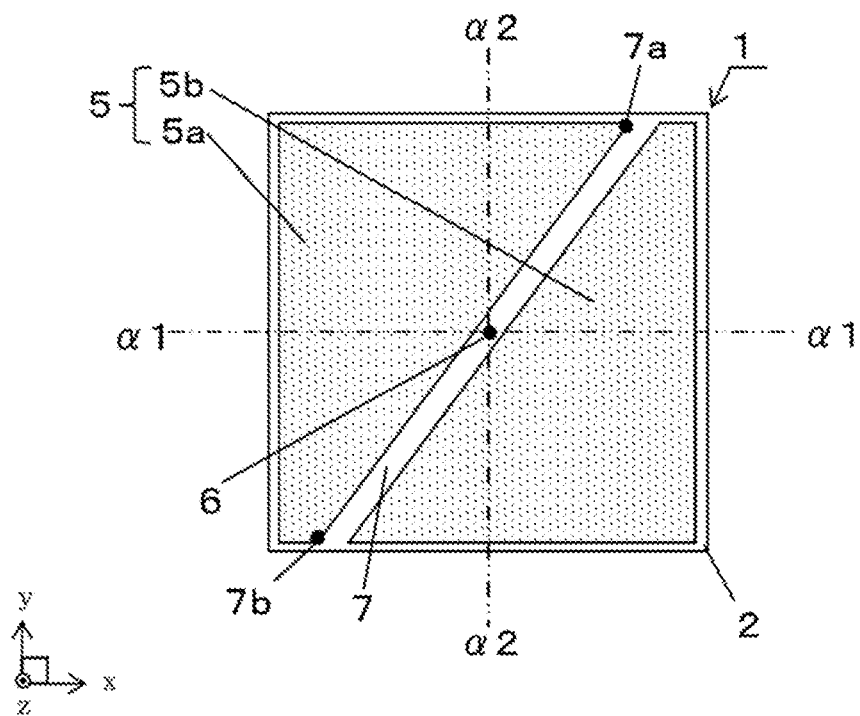
FIG. 3A is a plan view of the electronic component mounting board and the electronic device according to the first embodiment of the present invention showing an inner layer.

In the example shown in FIG. 3A, the space 7 between the first conductor layer 5a and the second conductor layer 5b extends substantially diagonally across the metal layer 5. The first conductor layer 5a and the second conductor layer 5b overlap the first imaginary line α1 and the second imaginary line α2 as viewed from above. The above structure can reduce such cracks or breaks around the space 7 between the first conductor layer 5a and the second conductor layer 5b. The above structure can thus more effectively reduce cracks or breaks, while producing the main advantages of the embodiments of the present invention.

Figure 3B:
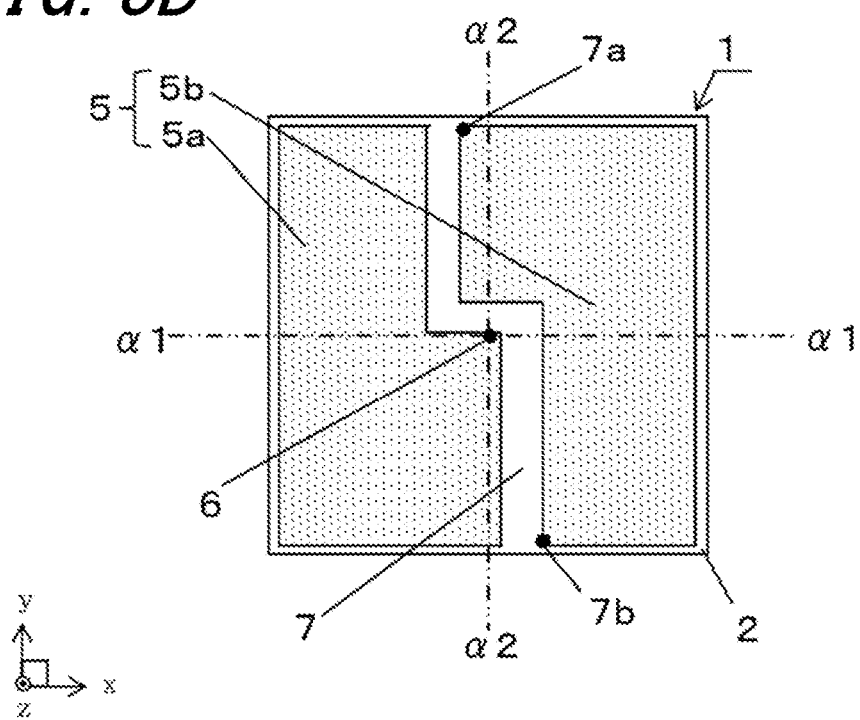
FIG. 3B is a plan view of an electronic component mounting board and an electronic device according to a modification of the first embodiment showing an inner layer.

In the example shown in FIG. 3B, the space 7 between the first conductor layer 5a and the second conductor layer 5b comprises a bend in x-direction as viewed from above. The first conductor layer 5a and the second conductor layer 5b overlap the first imaginary line α1 and the second imaginary line α2 as viewed from above. The electronic component mounting board 1 with the space 7 having the middle bend in x-direction can also reduce its part with a lower strength extending continuously at the space 7 between the first conductor layer 5a and the second conductor layer 5b. The structure can also produce the main advantages of the embodiments of the present invention.

In the example shown in FIG. 3B, the space 7 comprises right-angled corners. However, the corners may be obtuse-angled or arc-shaped. Such corners can reduce cracks in the first conductor layer 5a and/or the second conductor layer 5b that can increase electric resistance. The corners of the space 7 equate to the outer edges of the first conductor layer 5a and/or the second conductor layer 5b exposed to the space 7.

The space 7 between the first conductor layer 5a and the second conductor layer 5b may have the bend in x-direction as viewed from above located near the center of the metal layer 5 or near the outer edge of the metal layer 5. The space 7 between the first conductor layer 5a and the second conductor layer 5b having the bend in x-direction near the center of the metal layer 5 as viewed from above can reduce the decrease in the strength of the electronic component mounting board 1 in a manner well-balanced about the bent in the space 7 in the horizontal and vertical directions in the figures. Thus, the structure including the metal layer 5 extending across the entire substrate 2 effectively produces the advantages of the embodiments of the present invention. The space 7 between the first conductor layer 5a and the second conductor layer 5b having the bend in x-direction near the outer edge of the metal layer 5 as viewed from above can have the bend in the part likely to have a lower strength due to design limitations. This can more effectively produce the advantages of the embodiments of the present invention. Examples of the part likely to have a lower strength due to design limitations include a part having spaces 7 between multiple layers overlapping one another as viewed from above, a part near the corners of the substrate 2, and a part overlapping an area in which the electronic component 10 is mountable as viewed from above.

As in the examples shown in FIGS. 3A and 3B, the electronic component mounting board 1 may have the first end 7a and the second end 7b in the space 7 between the first conductor layer 5a and the second conductor layer 5b away from the first imaginary line α1 and the second imaginary line α2 as viewed from above. This structure prevents the space 7 between the first conductor layer 5a and the second conductor layer 5b from extending continuously toward and perpendicular to a pair of opposing sides of the substrate 2, and allows the metal layer 5 to be located adjacent to the space 7 in the vertical and horizontal directions in the figures. In other words, the space 7 between the first conductor layer 5a and the second conductor layer 5b is less likely to extend between and perpendicular to the opposing outer sides of the substrate 2. This reduces the decrease in the strength of the electronic component mounting board 1 at the space 7 between the first conductor layer 5a and the second conductor layer 5b, and thus reduces cracks or breaks in the thinner electronic component mounting board 1.

As in the example shown in FIG. 3A, the first conductor layer 5a and the second conductor layer 5b in the electronic component mounting board 1 may be point symmetrical about the center 6 at which the first imaginary line α1 and the second imaginary line α2 intersect with each other as viewed from above. This structure allows the space 7 between the first conductor layer 5a and the second conductor layer 5b to reduce the decrease in the strength of the electronic component mounting board 1 in a manner well-balanced about the center 6 in the horizontal and vertical directions in the figures. Thus, the structure including the metal layer 5 extending across the entire substrate 2 can effectively produce the advantages of the embodiments of the present invention.

Figure 4A:
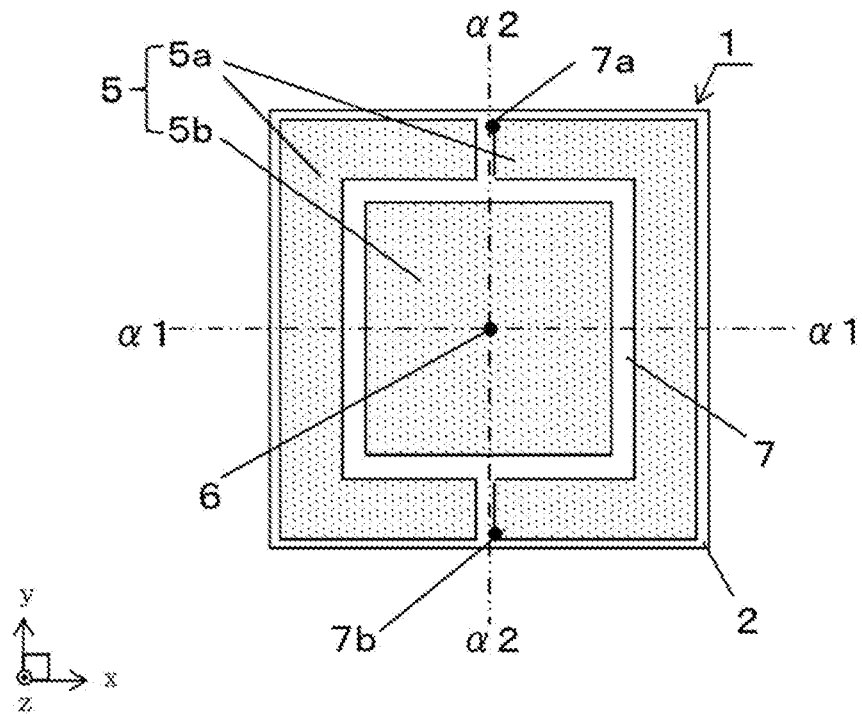
FIGS. 4A and 4B are plan views of electronic component mounting boards and electronic devices according to other modifications of the first embodiment of the present invention showing inner layers.
Figure 4B:
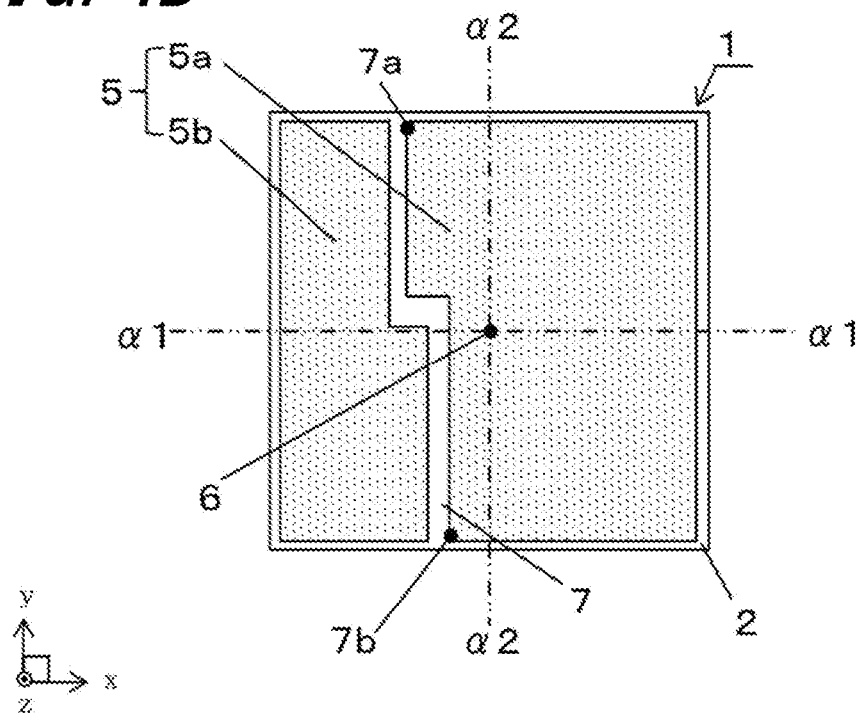

As in the example shown in FIG. 4A, the first conductor layer 5a and the second conductor layer 5b in the electronic component mounting board 1 may be line symmetrical about the first imaginary line α1 or the second imaginary line α2 as viewed from above. In the example shown in FIG. 4A, the first conductor layer 5a and the second conductor layer 5b in the electronic component mounting board 1 are line symmetrical about the second imaginary line α2. The structure allows the first conductor layer 5a and the second conductor layer 5b to have a similar surface area and a similar shape to each other about the first imaginary line α1 or the second imaginary line α2. The first conductor layer 5a and the second conductor layer 5b can thus have substantially the same resistance and other values. This structure can easily respond to any noise between the first conductor layer 5a and the second conductor layer 5b to improve electrical characteristics.

The electronic component mounting board 1 may include multiple metal layers 5 between multiple layers as in the examples shown in FIG. 1A to FIG. 2B, or may include a single metal layer 5 between two layers. The spaces 7 between the first conductor layers 5a and the second conductor layers 5b between multiple layers may or may not overlap each other as viewed from above. The first conductor layers 5a and the second conductor layers 5b between multiple layers may have the same shape or different shapes. Any of these variants produce the advantages of the embodiments of the present invention.

Electronic Device Structure

FIGS. 1A and 1B show an example of the electronic device 21. The electronic device 21 includes the electronic component mounting board 1 and the electronic component 10 mounted on the upper or lower surface of the electronic component mounting board 1.

The electronic device 21 includes the electronic component mounting board 1 and the electronic component 10 mounted on the electronic component mounting board 1. The electronic component 10 is, for example, an imaging device such as such as a complementary metal oxide semiconductor (CMOS) device or a charge-coupled device (CCD), a light-emitting device such as a light emitting diode (LED), or an integrated circuit such as a large-scale integrated circuit (LSI). The electronic component 10 may be mounted on the upper surface of the substrate 2 with an adhesive. The adhesive is, for example, silver epoxy or a thermosetting resin.

The electronic device 21 may include a lid 12 that covers the electronic component 10 and is bonded to the upper surface of the electronic component mounting board 1. In this structure, the electronic component mounting board 1 may have the lid 12 connected to the upper surface of a frame portion in the substrate 2, or include a frame that supports the lid 12 and surrounds the electronic component 10 on the upper surface of the substrate 2. The frame may be formed from the same material as or a material different from the material for the substrate 2.

When the frame and the substrate 2 are formed from the same material, they may be formed integrally with the uppermost insulating layer, with the frame on the substrate 2 having an opening. In another embodiment, they may be bonded together with a separately prepared brazing material.

When the substrate 2 and the frame are formed from different materials, the frame may be formed from, for example, the same material as the material for a lid bond 14 for bonding the lid 12 to the substrate 2. In this case, the lid bond 14 is thick enough to function both as a bonding member and a frame (as a support for the lid 12). Examples of the lid bond 14 include a thermosetting resin and a brazing material formed from glass with a low melting point or a metal component. The frame and the lid 12 may be formed from the same material. In this case, the frame and the lid 12 may be formed as one piece.

The lid 12 is a highly transparent member formed from, for example, a glass material when the electronic component 10 is an imaging device such as a CMOS and CCD, or a light-emitting device such as an LED. The lid 12 may be formed from a metallic material or an organic material when, for example, the electronic component 10 is an integrated circuit.

The lid 12 is bonded to the electronic component mounting board 1 with the lid bond 14. Examples of the material for the lid bond 14 include a thermosetting resin and a brazing material formed from glass with a low melting point or a metal component.

The electronic device 21 includes the electronic component mounting board 1 shown in FIGS. 1A and 1B to reduce the decrease in the strength against bending under external stress or vibrations.

Electronic Module Structure

FIGS. 2A and 2B show an example of the electronic module 31 including the electronic component mounting board 1. The electronic module 31 includes the electronic device 21 and a housing 32 either located at the upper surface of the electronic device 21 or covering the electronic device 21. In the example described below, the electronic module 31 is, for example, an imaging module.

The electronic module 31 includes the housing 32 (lens holder). The housing 32 improves hermetical sealing and prevents the electronic device 21 from directly receiving external stress. The housing 32 is formed from, for example, a resin or metal material. The lens holder as the housing 32 may incorporate one or more lenses formed from, for example, a resin, a liquid, glass, or quartz. The housing 32 may include, for example, a drive for vertical or horizontal driving, and may be electrically connected to the electronic component mounting board 1.

The housing 32 may have an opening in at least one of the four sides as viewed from above. Through the opening in the housing 32, an external circuit board may be placed for electrical connection to the electronic component mounting board 1. After the external circuit board is electrically connected to the electronic component mounting board 1, the opening in the housing 32 may be sealed with a sealant, such as a resin, to hermetically seal the inside of the electronic module 31.

Method for Manufacturing Electronic Component Mounting Board and Electronic Device An example method for manufacturing the electronic component mounting board 1 and the electronic device 21 according to the present embodiment will now be described. The example manufacturing method described below uses a multi-piece wiring substrate to be cut into the substrates 2.

(1) A ceramic green sheet that is to be the substrate 2 is prepared first. To obtain, for example, the substrate 2 formed from sintered aluminum oxide ($Al_2O_3$), powders, such as silica ($SiO_2$), magnesia (MgO), or calcium oxide (CaO), are added as a sintering aid to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin may be molded using a mold having a predetermined shape by transfer molding or injection molding. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, into the areas to be the metal layer 5 (the first conductor layer 5a and the second conductor layer 5b), the electrode pads 3, the electrodes for connection to external circuits, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2. The metal paste may be applied to have a predetermined space between the first conductor layer 5a and the second conductor layer 5b. This allows the space 7 to be between the first conductor layer 5a and the second conductor layer 5b.

(3) The above green sheet is then processed using, for example, a mold. This process may include forming a recess (through-hole) or a notch in a predetermined portion of the green sheet to be the substrate 2.

(4) The ceramic green sheets to be the insulating layers are then stacked and pressed to prepare a ceramic green sheet laminate to be the substrate 2 (or the electronic component mounting board 1).

(5) This ceramic green sheet laminate is then fired at about 1,500 to 1,800° C. to obtain a multi-piece wiring substrate including an array of substrates 2 (electronic component mounting boards 1). In this process, the metal paste described above is fired together with the ceramic green sheet to be the substrate 2 (electronic component mounting board 1) to form the metal layer 5 (the first conductor layer 5a and the second conductor layer 5b), the electrode pads 3, the electrodes for connection to external circuits, the inner wires, and the feedthrough conductors.

(6) The multi-piece wiring substrate resulting from the firing process is then cut into multiple substrates 2 (electronic component mounting boards 1). In this cutting process, separation grooves may be formed along the outer edge of each of the substrates 2 (electronic component mounting boards 1), and the multi-piece wiring substrate may be split along the separation grooves into the multiple substrates 2 (electronic component mounting boards 1). In other embodiments, the multi-piece wiring substrate may be cut along the outer edge of each of the substrates 2 (electronic component mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple substrates 2 (electronic component mounting boards 1), the electrode pads 3, the pads for external connection, and the uncovered wiring conductors may be plated by electro-plating or electroless plating.

(7) The electronic component 10 is then mounted on the upper or lower surface of the electronic component mounting board 1. The electronic component 10 is electrically connected to the electronic component mounting board 1 by, for example, wire bonding. The electronic component 10 may be fixed onto the electronic component mounting board 1 with an adhesive or another bond applied to the electronic component 10 or to the electronic component mounting board 1. After the electronic component 10 is mounted on the electronic component mounting board 1, the lid 12 may be bonded to the electronic component mounting board 1 with the lid bond 14.

The electronic device 21 is obtained by fabricating the electronic component mounting board 1 and mounting the electronic component 10 on the electronic component mounting board 1 through the processes (1) to (7). The processes (1) to (7) may be performed in any order.

Second Embodiment

Figure 5A:
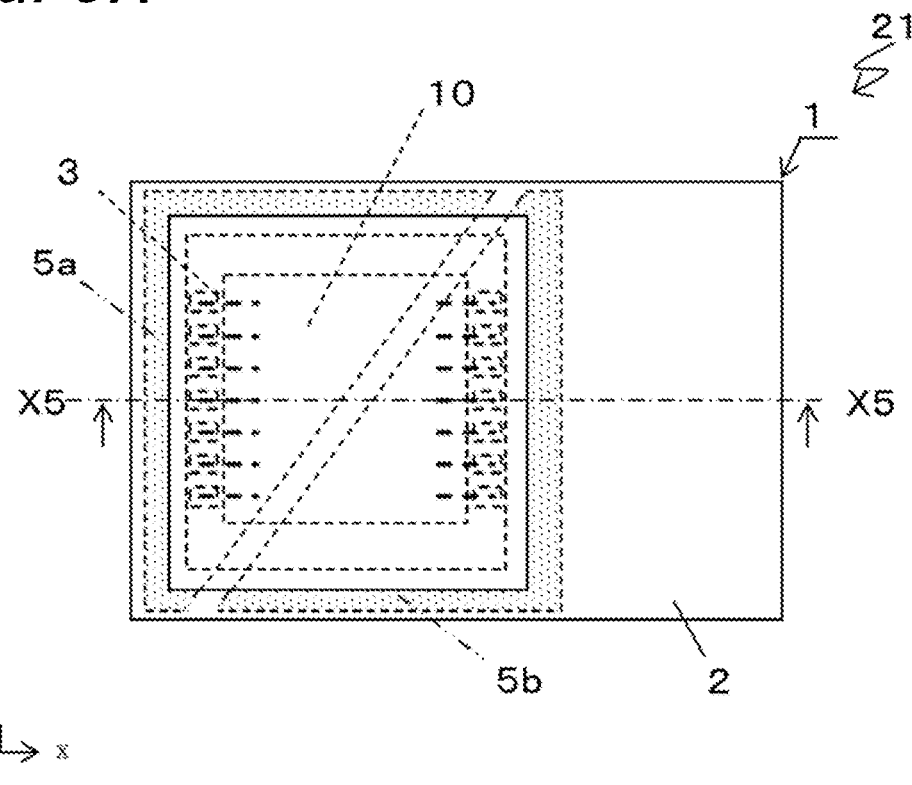
FIG. 5A is an external top view of an electronic component mounting board and an electronic device according to a second embodiment of the present invention.
Figure 5B:
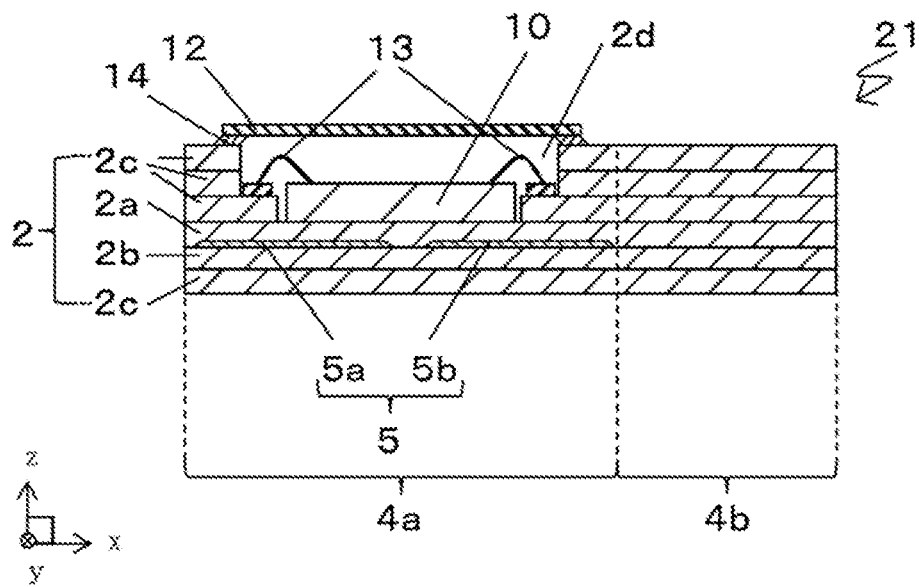
FIG. 5B is a cross-sectional view taken along line X5-X5 in FIG. 5A.

An electronic device 21 and an electronic component mounting board 1 according to a second embodiment of the present invention will be described with reference to FIGS. 5A to 7B. An inner layer included in the electronic component mounting board 1 according to the second embodiment of the present invention will be described with reference to FIGS. 6A to 7B. The electronic device 21 according to the present embodiment includes the electronic component mounting board 1 and an electronic component 10. In the present embodiment, FIGS. 5A and 5B show the electronic device 21, and FIGS. 6A to 7B show the inner layer of the electronic component mounting board 1. In FIGS. 6A to 7B, a metal layer 5 (a first conductor layer 5a and a second conductor layer 5b) is indicated by dots and solid lines, and a first imaginary line α1 and a second imaginary line α2 are drawn with two-dot chain lines.

The electronic component mounting board 1 includes a quadrangular substrate 2, which includes a first area 4a having a recess 2d in which the electronic component 10 is mountable and a second area 4b adjacent to the first area 4a. The substrate 2 includes a first layer 2a, and a second layer 2b located at the lower surface of the first layer 2a. The substrate 2 includes the metal layer 5 between the first layer 2a and the second layer 2b in the first area 4a or the second area 4b as viewed from above. The metal layer 5 includes a first conductor layer 5a and a second conductor layer 5b located with a space 7 from the first conductor layer 5a. The space 7 between the first conductor layer 5a and the second conductor layer 5b in the electronic component mounting board 1 extends from a first end 7a of the metal layer 5 to a second end 7b of the metal layer 5 different from the first end 7a as viewed from above. The metal layer 5 in the electronic component mounting board 1 overlaps the first imaginary line α1, which is parallel to one side of the substrate 2 and passes through a center 6 of the first area 4a or the second area 4b, and the second imaginary line α2, which is perpendicular to the first imaginary line α1 and passes through the center 6 of the first area 4a or the second area 4b as viewed from above.

The structure of the electronic device 21, and the basic materials, conditions, and structures of the electronic component mounting board 1, which includes the first layer 2a, the second layer 2b, the electrode pads 3, the metal layer 5 (the first conductor layer 5a and the second conductor layer 5b), the space 7, and other parts, and the substrate 2 in the present embodiment are similar to those described in the first embodiment, and will not be described. The features in the second embodiment will simply be described.

The electronic component mounting board 1 includes the quadrangular substrate 2, which includes the first area 4a having the recess 2d in which the electronic component 10 is mountable and the second area 4b adjacent to the first area 4a. The substrate 2 includes the first layer 2a, and the second layer 2b located at the lower surface of the first layer 2a. The substrate 2 in the electronic component mounting board 1 is formed from the materials described in the first embodiment. The substrate 2 comprises the recess 2d, which receives the electronic component 10, at the center 6 of the substrate 2 or a position deviating from the center 6 of the substrate 2. In the example shown in FIGS. 5A and 5B, the recess 2d is defined by three additional layers 2c stacked on one another. In other embodiments, the recess 2d may be defined by one or two, or four or more additional layers 2c stacked on one another. As in the example shown in FIGS. 5A and 5B, the opening of the recess 2d may have a step that is defined by layers with different sizes, on which the electrode pads 3 may be placed. The layers defining the recess 2d may be the additional layers 2c, or the first layer 2a and/or the second layer 2b. The second area 4b may eliminate the recess 2d and may be a flat plate. The electronic component mounting board 1 with the flat second area 4b can have a higher strength than the structure having a recess 2d in both the first area 4a and the second area 4b.

The electronic component mounting board 1 includes the first area 4a having the recess 2d and the second area 4b adjacent to the first area 4a. The first area 4a may be about the same size as the recess 2d or may be larger than the area in which a lid is attached to the electronic device 21 as in the example shown in FIGS. 5A and 5B. The second area 4b is adjacent to the first area 4a in the electronic component mounting board 1, and may receive electronic parts other than the electronic component 10, such as capacitors, coils, and semiconductor devices.

The electronic component mounting board 1 includes the first conductor layer 5a and the second conductor layer 5b separated by the space 7, which extends from the first end 7a of the metal layer 5 to the second end 7b of the metal layer 5 different from the first end 7a as viewed from above. The metal layer 5 in the electronic component mounting board 1 overlaps the first imaginary line α1, which is parallel to one side of the substrate 2 and passes through the center 6 of the first area 4a or the second area 4b, and the second imaginary line α2, which is perpendicular to the first imaginary line α1 and passes through the center 6 of the first area 4a or the second area 4b as viewed from above.

In response to this, the electronic component mounting board 1 according to the embodiments of the present invention comprises the above structure, in which the metal layer 5 is located in the first area 4a and thus the space 7 between the first conductor layer 5a and the second conductor layer 5b does not continuously extend toward and perpendicular to the pair of opposing sides of the substrate 2, and the metal layer 5 is located adjacent to the space 7 in the vertical and horizontal directions in the figures. This reduces the decrease in the strength of electronic component mounting board 1 at the space 7 between the first conductor layer 5a and the second conductor layer 5b, and thus reduces cracks or breaks in the thinner electronic component mounting board 1. The above structure can further reduce cracks or breaks under pressure applied during mounting of the electronic component 10.

In response to this, the electronic component mounting board 1 according to the present embodiment comprises the above structure, in which the metal layer 5 is located in the second area 4b and thus the space 7 between the first conductor layer 5a and the second conductor layer 5b does not continuously extend toward and perpendicular to the pair of opposing side of the substrate 2, and the metal layer 5 is located adjacent to the space 7 in vertical and horizontal directions in the figures. This reduces the decrease in the strength of the electronic component mounting board 1 at the space 7 between the first conductor layer 5a and second conductor layer 5b. Any highly functional electronic component mounting board 1 with a larger second area 4b thus comprises less cracks or breaks.

When the layer defining the recess 2d is the first layer 2a and/or the second layer 2b, the electronic component mounting board 1 may include the metal layer 5 in the second area 4b between the first layer 2a and/or the second layer 2b defining the recess 2d. This structure can also produce the advantages of the embodiments of the present invention, and reduce cracks or breaks in the second area 4b under the pressure applied during mounting of the electronic parts.

The electronic component mounting board 1 may include the metal layer 5 in either the first area 4a or the second area 4b or both the first area 4a and the second area 4b. The metal layer 5 located in both the first area 4a and the second area 4b can reduce cracks or breaks in both the first area 4a and the second area 4b.

Figure 6A:
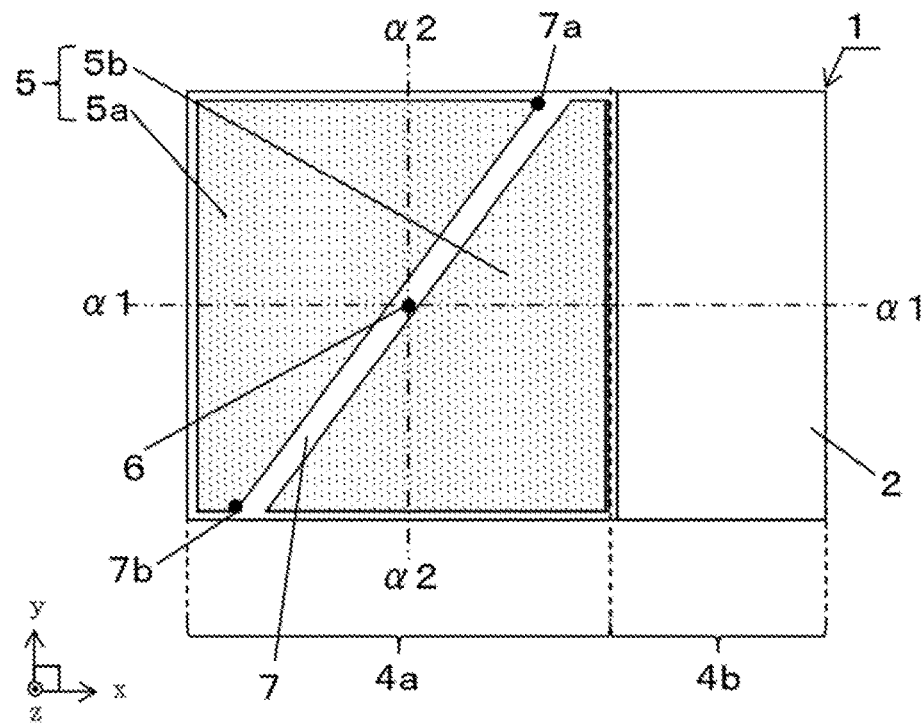
FIG. 6A is a plan view of the electronic component mounting board and the electronic device according to the second embodiment of the present invention showing an inner layer.
Figure 6B:
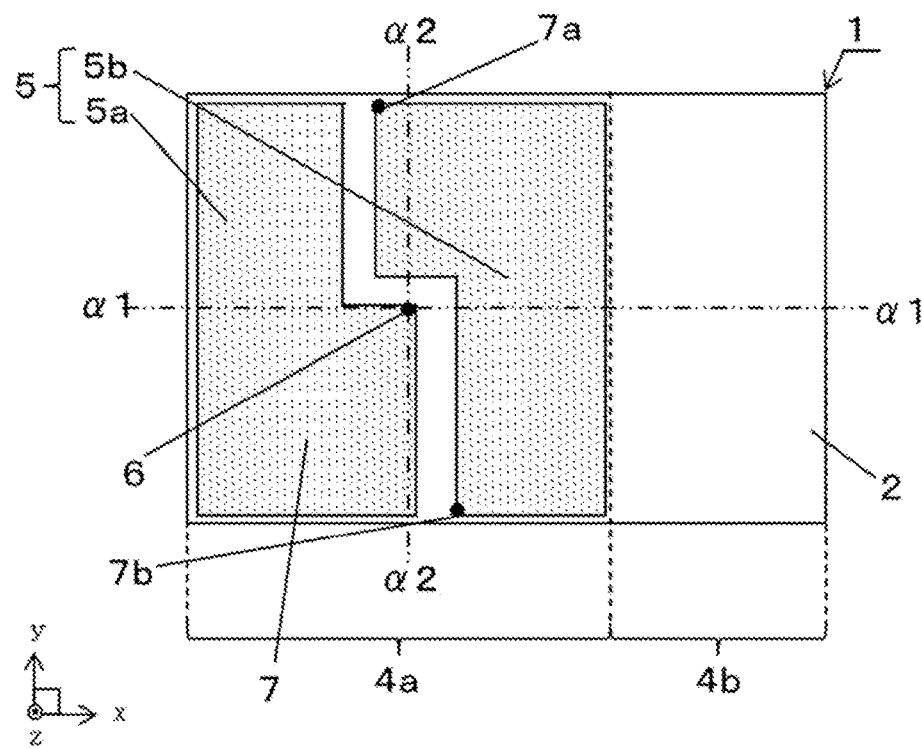
FIG. 6B is a plan view of an electronic component mounting board and an electronic device according to a modification of the second embodiment showing an inner layer.

FIGS. 6A and 6B are plan views of the structure according to the present embodiment showing an inner layer, in which the first area 4a includes the metal layer 5. The first area 4a comprises substantially a center 6 that may deviate from its precise center by about 30 μm. The center 6 of the first area 4a is, for example, the intersection of two imaginary diagonal lines of the first area 4a or the intersection of two imaginary lines that pass the midpoints of two pairs of opposing outer sides of the first area 4a.

Figure 7A:
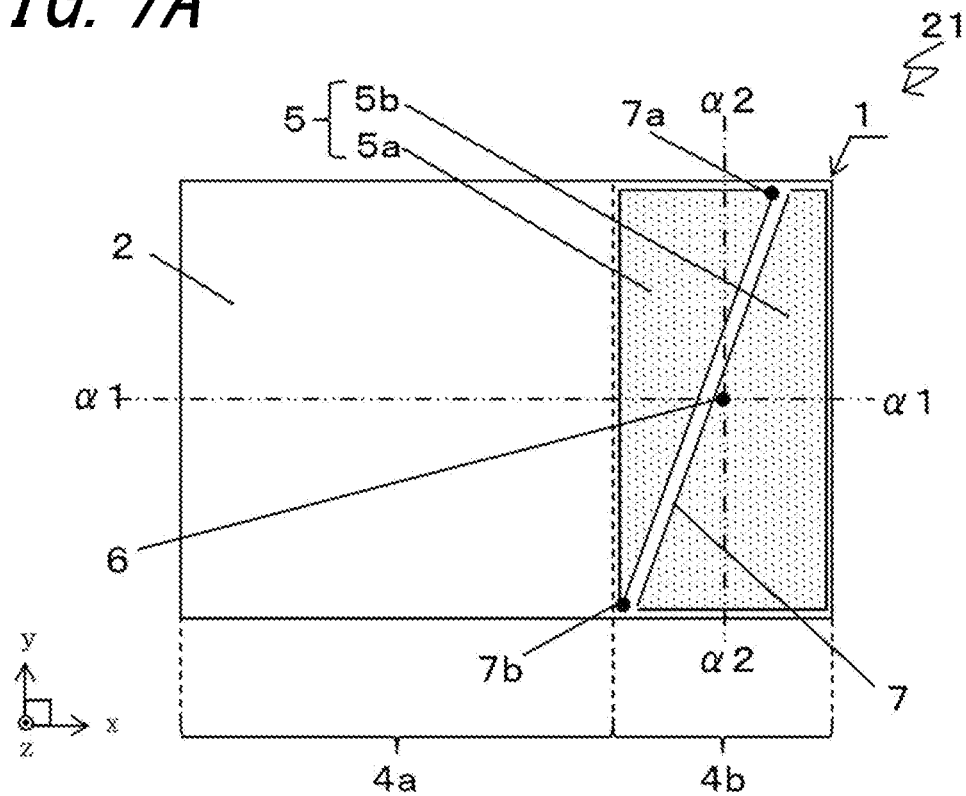
FIGS. 7A and 7B are plan views of electronic component mounting boards and electronic devices according to other modifications of the second embodiment of the present invention showing inner layers.
Figure 7B:
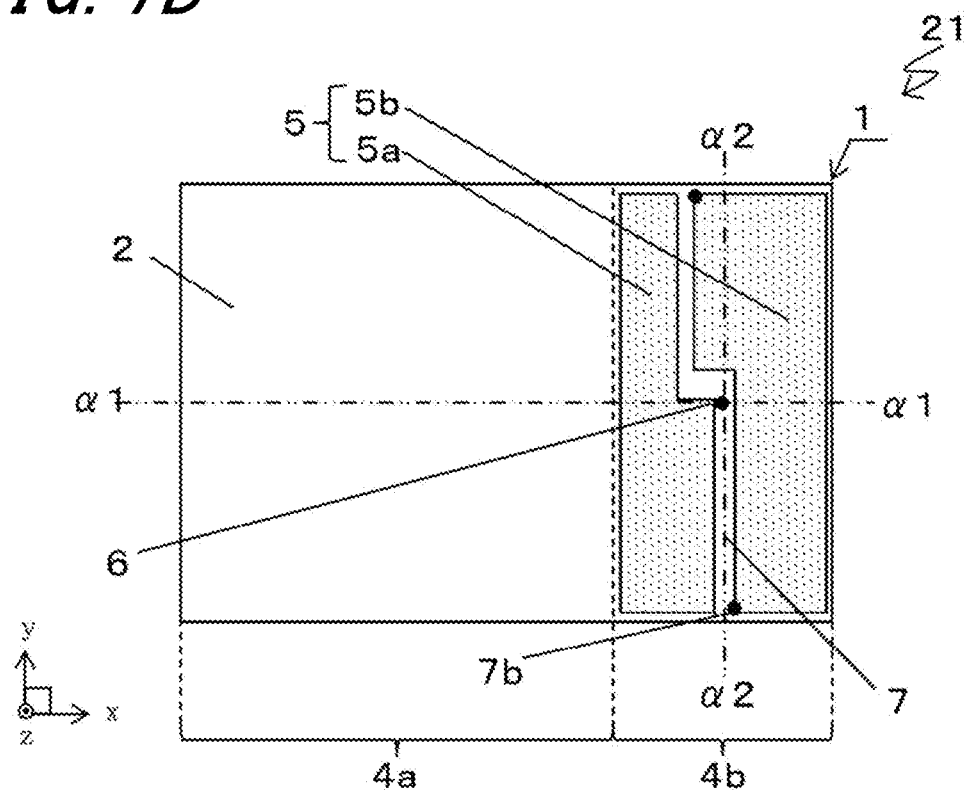

FIGS. 7A and 7B are plan views of the structure according to the present embodiment showing an inner layer, in which the second area 4b includes the metal layer 5. The second area 4b comprises substantially a center 6 that may deviate from its precise center by about 30 μm. The center 6 of the second area 4b is, for example, the intersection of two imaginary diagonal lines of the second area 4b or the intersection of two imaginary lines that pass the midpoints of two pairs of opposing outer sides of the second area 4b.

As in the examples shown in FIGS. 6A and 7A, the electronic component mounting board 1 may have the first end 7a and the second end 7b at the space 7 between the first conductor layer 5a and the second conductor layer 5b away from both the first imaginary line α1 and the second imaginary line α2 as viewed from above. This structure can prevent the space 7 between the first conductor layer 5a and the second conductor layer 5b from extending continuously toward and perpendicular to a pair of opposing sides of the substrate 2, and allows the metal layer 5 to be located adjacent to the space 7 in the vertical and horizontal directions in the figures. In other words, the space 7 between the first conductor layer 5a and the second conductor layer 5b is less likely to extend between and perpendicular to the opposing outer sides of the substrate 2. This structure reduces the decrease in the strength of the electronic component mounting board 1 at the space 7 between the first conductor layer 5a and the second conductor layer 5b, thus reducing cracks or breaks in the first area 4a or the second area 4b.

As in the examples shown in FIGS. 6A and 7A, the first conductor layer 5a and the second conductor layer 5b in the electronic component mounting board 1 may be point symmetrical about the center 6 at which the first imaginary line α1 and the second imaginary line α2 intersect with each other as viewed from above. This allows the space 7 between the first conductor layer 5a and the second conductor layer 5b to reduce the decrease in the strength of the electronic component mounting board 1 in a manner well-balanced about the center 6 in the vertical and horizontal directions in the figures. Thus, the structure including the metal layer 5 extending across the entire substrate 2 in the first area 4a or the second area 4b can effectively produce the advantages of the embodiments of the present invention.

Method for Manufacturing Electronic Component Mounting Board and Electronic Device An example method for manufacturing the electronic component mounting board 1 and the electronic device 21 according to the present embodiment will now be described. The method for manufacturing the electronic component mounting board 1 and the electronic device 21 according to the present embodiment is basically similar to the manufacturing method described in the first embodiment. The processes of forming the recess 2d and the metal layer 5 will be described.

The recess 2d is formed by, for example, forming an opening at a predetermined position using a mold or a laser beam through a ceramic green sheet prepared in the same manner as with the manufacturing method described in the first embodiment. This process is preceded or followed by forming the metal layer 5 in the first area 4a and/or the second area 4b of the ceramic green sheet having the opening. Similarly to the metal layer 5 described in the first embodiment, the metal layer 5 in the present embodiment is formed by applying a metal paste to the ceramic green sheet obtained in the process (1) in the first embodiment by screen printing or other techniques. The metal paste is applied into the areas to be the first area 4a and/or the second area 4b to form the metal layer 5 in the present embodiment. The metal paste may be applied to have a predetermined space between the first conductor layer 5a and the second conductor layer 5b. This forms the space 7 separating the first conductor layer 5a and the second conductor layer 5b.

Third Embodiment

Figure 8:
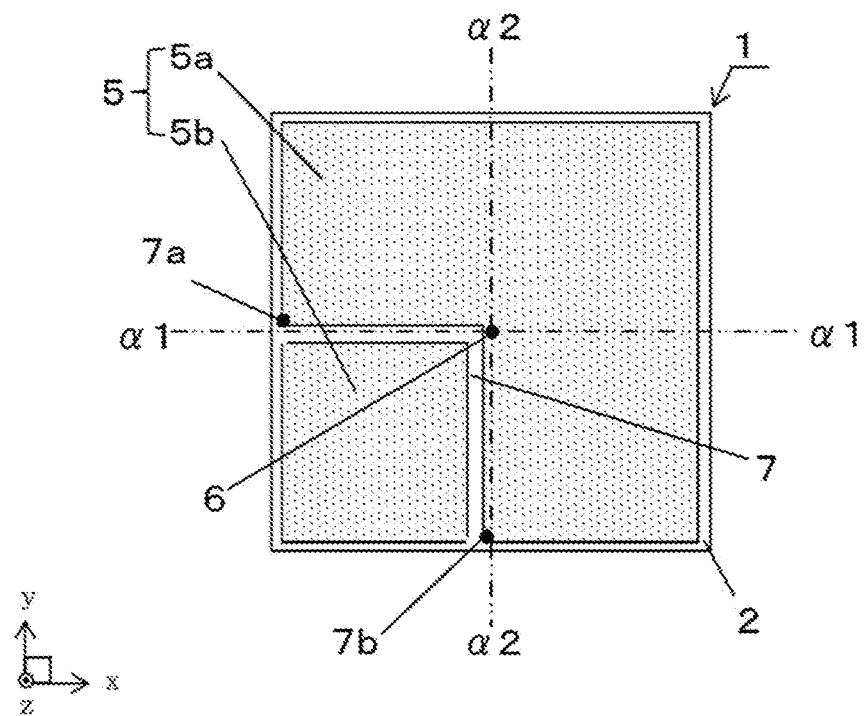
FIG. 8 is a plan view of an electronic component mounting board and an electronic device according to a third embodiment of the present invention showing an inner layer.

An electronic component mounting board 1 according to a third embodiment of the present invention will now be described with reference to FIG. 8. The electronic component mounting board 1 according to the present embodiment differs from the electronic component mounting board 1 according to the first embodiment in that a first conductor layer 5a and a second conductor layer 5b have different shapes. In FIG. 8, a metal layer 5 (the first conductor layer 5a and the second conductor layer 5b) is indicated by dots and solid lines, and a first imaginary line α1 and a second imaginary line α2 are drawn with two-dot chain lines.

In the example shown in FIG. 8, the first conductor layer 5a included in the metal layer 5 overlaps the first imaginary line α1 and the second imaginary line α2 for the substrate 2, whereas the second conductor layer 5b does not overlap the first imaginary line α1 and the second imaginary line α2. In this structure, a space 7 between the first conductor layer 5a and the second conductor layer 5b continuously extends partially toward and perpendicular to a pair of opposing sides of the substrate 2, and is adjacent to the first conductor layer 5a or the second conductor layer 5b. The first conductor layer 5a or the second conductor layer 5b adjacent to the space 7 can reduce cracks or breaks that can occur or propagate when the space 7 between the first conductor layer 5a and the second conductor layer 5b in the electronic component mounting board 1 receives stress. This structure produces the advantages of the embodiments of the present invention.

To form the first conductor layer 5a included in the metal layer 5 overlapping the first imaginary line α1 and the second imaginary line α2 for the substrate 2 and the second conductor layer 5b without overlapping the first imaginary line α1 and the second imaginary line α2 as in the example shown in FIG. 8, the first conductor layer 5a and the second conductor layer may have largely different sizes. The first conductor layer 5a and the second conductor layer 5b with largely different sizes can have intended resistance adjusted for each conductor layer. This allows, for example, the first conductor layer 5a to function as a ground for analog signals and the second conductor layer 5b to function as a ground for digital signals in the electronic component 10 that uses both analog signals and digital signals. This can improve electrical characteristics for digital signals. Thus, the structure according to the present embodiment can improve electrical characteristics while providing the advantages of the embodiments of the present invention.

Fourth Embodiment

Figure 9:
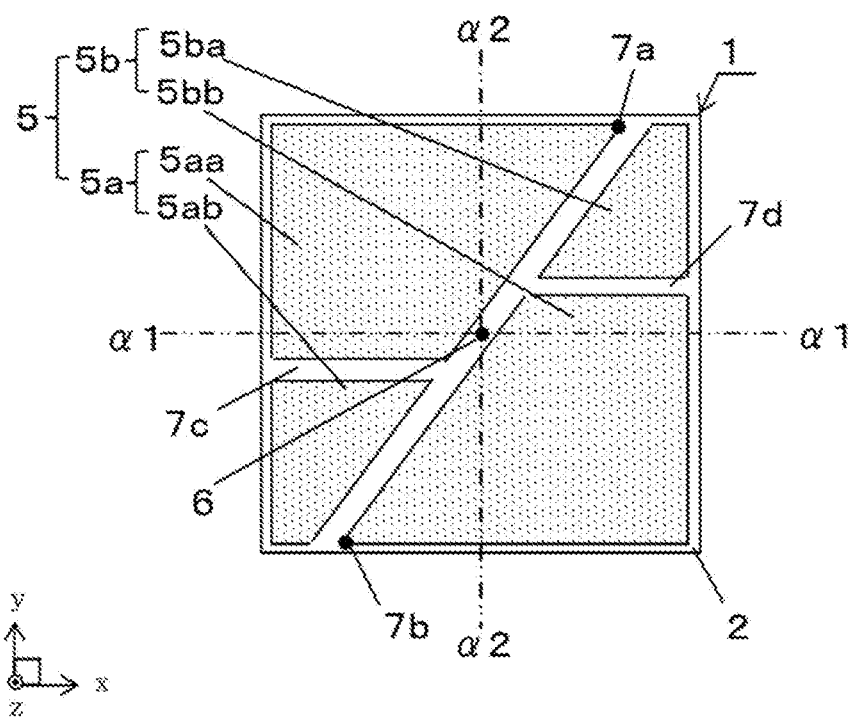
FIG. 9 is a plan view of an electronic component mounting board and an electronic device according to a fourth embodiment of the present invention showing an inner layer.

An electronic component mounting board 1 according to a fourth embodiment of the present invention will now be described with reference to FIG. 9. The electronic component mounting board 1 according to the present embodiment differs from the electronic component mounting board 1 according to the first embodiment in that a first conductor layer 5a and a second conductor layer 5b each include multiple areas. In FIG. 9, a metal layer 5 is indicated by dots and solid lines (the first conductor layer 5a and the second conductor layer 5b), and a first imaginary line α1 and a second imaginary line α2 are drawn with two-dot chain lines.

In the example shown in FIG. 9, the electronic component mounting board 1 includes the first conductor layer 5a, which includes a third conductor layer 5aa and a fourth conductor layer 5ab located with a space (hereafter, a second space 7c) from the third conductor layer 5aa, and the second conductor layer 5b, which includes a fifth conductor layer 5ba and a sixth conductor layer 5bb located with a space (hereafter, a third space 7d) from the fifth conductor layer 5ba. In other words, the first conductor layer 5a includes the third conductor layer 5aa and the fourth conductor layer 5ab, and the second conductor layer 5b includes the fifth conductor layer 5ba and the sixth conductor layer 5bb. The metal layer 5 thus includes four conductor layers in total. The multiple conductor layers allow the electrodes connected to the conductor layers to have different potentials. This structure in which the metal layer 5 overlaps the first imaginary line α1 and the second imaginary line α2 can also produce the advantages of the embodiments of the present invention.

As in the example shown in FIG. 9, the second space 7c between the third conductor layer 5aa and the fourth conductor layer 5ab included in the first conductor layer 5a and the third space 7d between the fifth conductor layer 5ba and the sixth conductor layer 5bb included in the second conductor layer 5b are separated by the space 7 and may not be aligned with each other as viewed from above. This structure can prevent, for example, cracks or breaks occurring in the second space 7c from propagating into the space 7d through the space 7 and causing cracks or breaks in the entire substrate.

The third conductor layer 5aa and the fourth conductor layer 5ab included in the first conductor layer 5a or the fifth conductor layer 5ba and the sixth conductor layer 5bb included in the second conductor layer 5b may have different potentials or signals or may have the same potential or signal, and may be electrically connected to another part, such as an upper layer or a lower layer.

The second space 7c between the third conductor layer 5aa and the fourth conductor layer 5ab included in the first conductor layer 5a or the third space 7d between the fifth conductor layer 5ba and the sixth conductor layer 5bb included in the second conductor layer 5b may be, for example, at least 20 µm or at least 1% of one side of the substrate 2. When the third conductor layer 5aa and the fourth conductor layer 5ab included in the first conductor layer 5a or the fifth conductor layer 5ba and the sixth conductor layer 5bb included in the second conductor layer 5b are wide and flat wires serving as a ground potential or a power potential, the substrate may include an additional signal wire, such as a signal wire, in the second space 7c between the third conductor layer 5aa and the fourth conductor layer 5ab included in the first conductor layer 5a or the third space 7d between the fifth conductor layer 5ba and the sixth conductor layer 5bb included in the second conductor layer 5b.

The third conductor layer 5aa and the fourth conductor layer 5ab included in the first conductor layer 5a or the fifth conductor layer 5ba and the sixth conductor layer 5bb included in the second conductor layer 5b may be formed from the same material as the first conductor layer 5a and the second conductor layer 5b described in the first embodiment. The third conductor layer 5aa and the fourth conductor layer 5ab included in the first conductor layer 5a may be formed from different materials. Similarly, the fifth conductor layer 5ba and the sixth conductor layer 5bb included in the second conductor layer 5b may be formed from different materials.

The method for manufacturing the electronic component mounting board 1 shown in FIG. 9 is basically similar to the manufacturing method described in the first embodiment. The electronic component mounting board 1 may be manufactured by applying a metal paste to be the third conductor layer 5aa and the fourth conductor layer 5ab included in the first conductor layer 5a or the fifth conductor layer 5ba and the sixth conductor layer 5bb included in the second conductor layer 5b to the ceramic green sheet in one process or separate processes with a printing method predetermined for each layer.

Fifth Embodiment

Figure 10A:
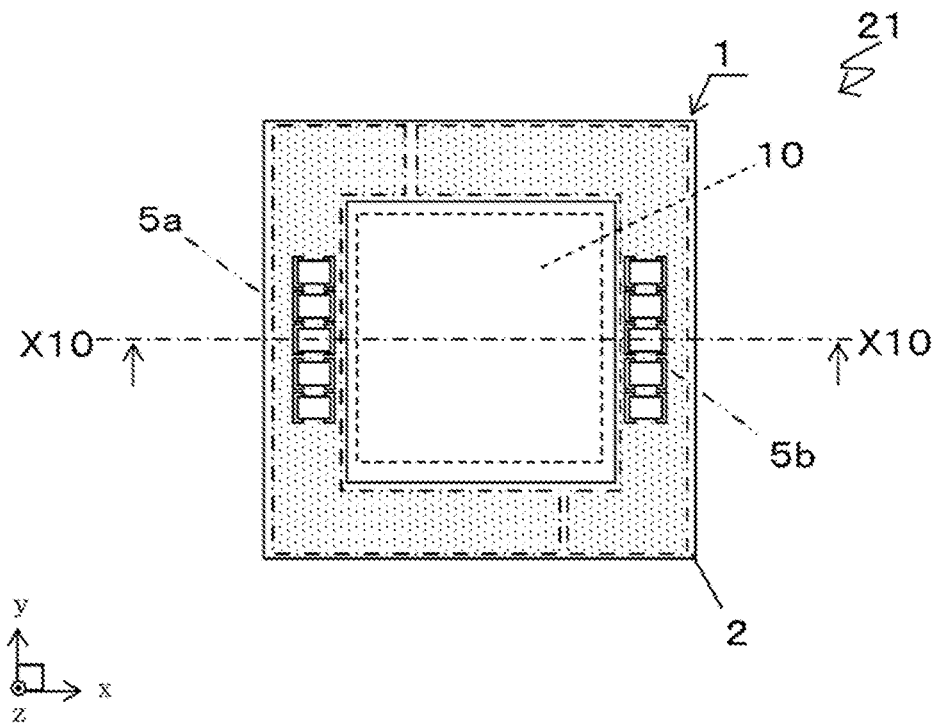
FIG. 10A is an external top view of an electronic component mounting board and an electronic device according to a fifth embodiment of the present invention.
Figure 10B:
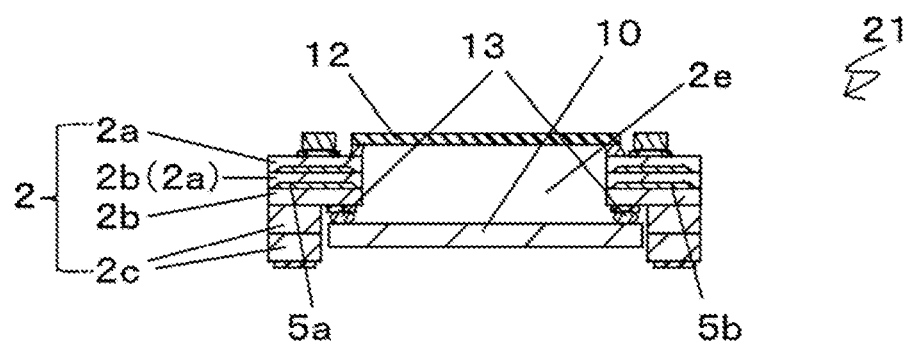
FIG. 10B is a cross-sectional view taken along line X10-X10 in FIG. 10A.
Figure 11:
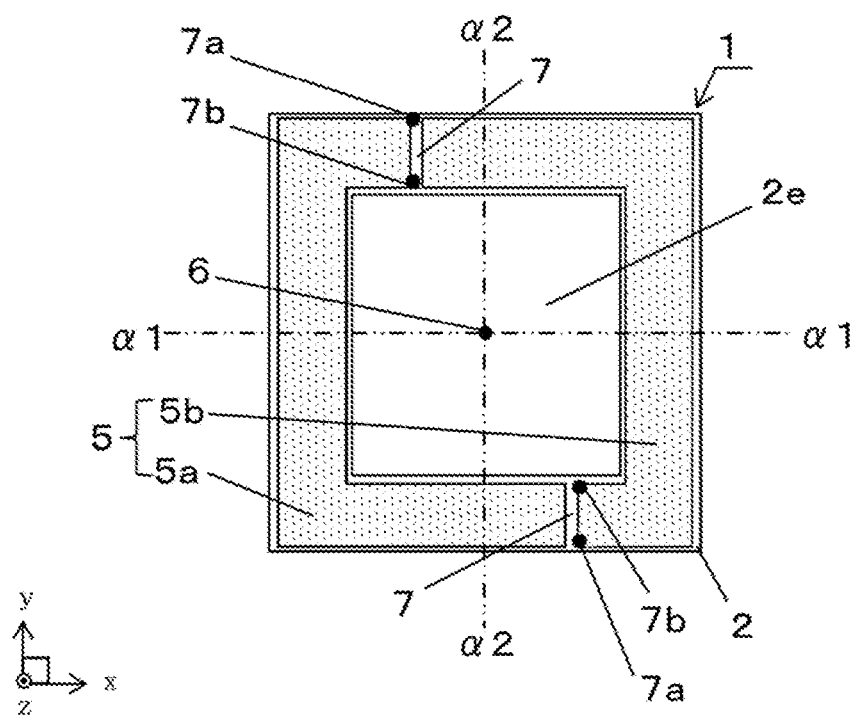
FIG. 11 is a plan view of the structure according to the fifth embodiment of the present invention showing an inner layer.

An electronic component mounting board 1 according to a fifth embodiment of the present invention will now be described with reference to FIGS. 10A to 11. FIGS. 10A and 10B show the shapes of the electronic component mounting board 1 and an electronic device according to the present embodiment. FIG. 11 shows an inner layer of the board shown in FIGS. 10A and 10B. The electronic component mounting board 1 according to the present embodiment differs from the electronic component mounting board 1 according to the first embodiment in that a substrate 2 comprises a through-hole (or the electronic component 10 is mounted differently) and a first conductor layer 5a and a second conductor layer 5b have ends in a space 7 at different positions. In FIGS. 10A to 11, a metal layer 5 is indicated by dots and solid lines (the first conductor layer 5a and the second conductor layer 5b), and a first imaginary line α1 and a second imaginary line α2 are drawn with two-dot chain lines.

In the example shown in FIGS. 10A and 10B, the electronic component mounting board 1 includes the substrate 2, which comprises a through-hole 2e to receive the electronic component 10 to be mounted on the electronic device 21 as viewed from above. More specifically, the through-hole 2e may be slightly smaller than the electronic component as viewed from above. This structure allows the electronic component 10 to be mounted under the substrate 2 at a sufficiently long distance from the lens when, for example, the electronic component 10 is an imaging device. This reduces the height of the electronic module 31 further. The electronic component mounting board 1 allows electronic parts to be mounted on its surface. The structure shown in FIGS. 10A and 10B allows more electronic parts to be mountable, and thus can further reduce the size of the electronic device. The through-hole 2e may be formed around the center of the substrate 2 or may deviate from the center of the substrate 2.

The electronic parts may be, for example, passive components including chip capacitors, inductors, and resistors, and active components including optical image stabilizers (OISs), signal processors, and gyro sensors. The electronic parts are connected to the pads on the substrate 2 with a bond, such as solder or a conductive resin. The electronic parts may be connected to the electronic component 10 with the inner wires in the substrate 2.

The electronic component 10 in FIGS. 10A and 10B may be first bonded to the electronic component mounting board 1 with an electronic component connection 13, such as gold bumps and solder balls, and then may be sealed with a sealant to strengthen the bonding. The electronic component 10 may be bonded with an electronic component connection 13 including an anisotropic conductive film (ACF).

FIG. 11 shows the inner layer according to the present embodiment. In the example shown in FIG. 11, the substrate 2 with the through-hole 2e is narrower than the substrate 2 described in the first embodiment. This structure can have cracks propagating into breaks under stress applied in the space 7 between the first conductor layer 5a and the second conductor layer 5b. However, the substrate 2 with the through-hole 2e as in the example shown in FIG. 11 comprises the metal layer 5 overlapping the first imaginary line α1 and the second imaginary line α2, and produces the advantages of the embodiments of the present invention.

When the substrate 2 comprises the through-hole 2e as in the example shown in FIG. 11, the space 7 between the first conductor layer 5a and the second conductor layer 5b extends from a first end 7a of the metal layer 5 near the outer edge of the substrate 2 to another end of the metal layer different from the first end 7a, or to a second end 7b near the periphery of the through-hole 2e as in the example shown in FIG. 11. The substrate 2 with the through-hole 2e thus comprises two or more spaces 7 between the first conductor layer 5a and the second conductor layer 5b, and two or more first ends 7a and two or more second ends 7b.

As in the example shown in FIG. 11, the two spaces 7 between the first conductor layer 5a and the second conductor layer 5b separated by the through-hole 2e may be at positions deviating from each other. This structure can further prevent, for example, cracks or breaks occurring in the upper space 7 in the figure from propagating into the lower space 7 in the figure through the through-hole 2e and causing cracks or breaks in the entire substrate.

A method for manufacturing the electronic component mounting board 1 shown in FIGS. 10A to 11 includes, in addition to the processes described in the first embodiment, forming a through-hole 2e at an intended position using a mold or a laser beam through the ceramic green sheet to be the substrate 2. The process is followed by the same processes as described in the first embodiment to complete the electronic component mounting board 1 shown in FIGS. 10A to 11.

Sixth Embodiment

Figure 12:
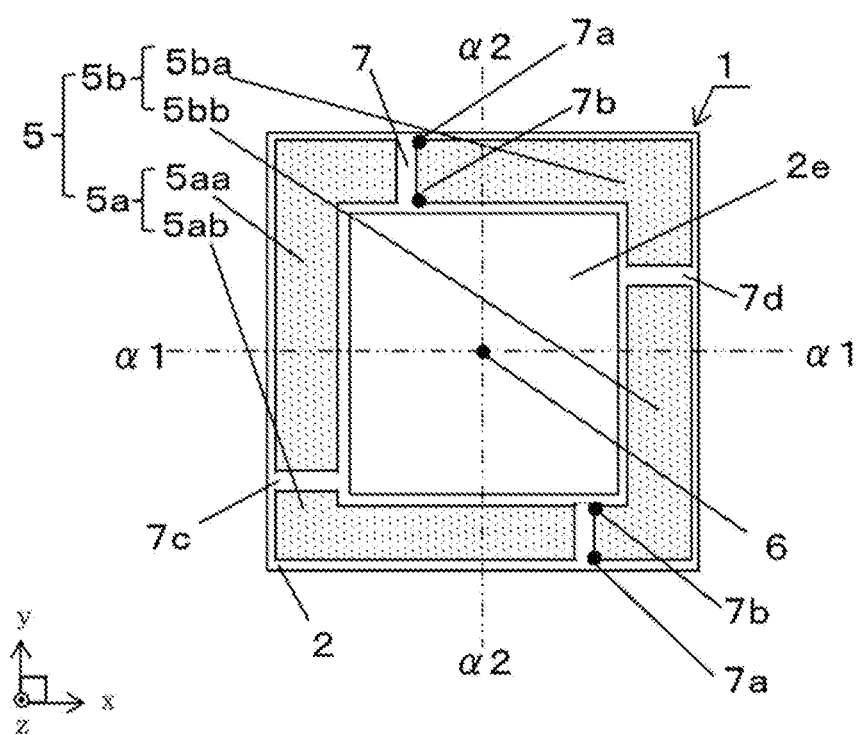
FIG. 12 is a plan view of the structure according to a sixth embodiment of the present invention showing an inner layer.

An electronic component mounting board 1 according to a sixth embodiment of the present invention will now be described with reference to FIG. 12. The electronic component mounting board 1 according to the present embodiment differs from the electronic component mounting board 1 according to the fifth embodiment in that a first conductor layer 5a and a second conductor layer 5b each include multiple areas. In FIG. 12, a metal layer 5 is indicated by dots and solid lines (the first conductor layer 5a and the second conductor layer 5b), and a first imaginary line α1 and a second imaginary line α2 are drawn with two-dot chain lines.

In the example shown in FIG. 12, the electronic component mounting board 1 includes the first conductor layer 5a, which includes a third conductor layer 5aa and a fourth conductor layer 5ab located with a space (hereafter, a second space 7c) from the third conductor layer, and the second conductor layer 5b, which includes a fifth conductor layer 5ba and a sixth conductor layer 5bb located with a space (hereafter, a third space 7d) from the fifth conductor layer 5ba. The metal layer 5 thus includes four conductor layers in total. This structure in which the metal layer 5 overlaps the first imaginary line α1 and the second imaginary line α2 can also produce the advantages of the embodiments of the present invention.

As in the example shown in FIG. 12, the second space 7c between the third conductor layer 5aa and the fourth conductor layer 5ab included in the first conductor layer 5a and the third space 7d between the fifth conductor layer 5ba and the sixth conductor layer 5bb included in the second conductor layer 5b are separated by a through-hole 2e and may be at positions deviating from each other as viewed from above. This structure can prevent, for example, cracks or breaks occurring in the second space 7c from propagating into the third space 7d through the through-hole 2e and causing cracks or breaks in the entire substrate.

The third conductor layer 5aa and the fourth conductor layer 5ab included in the first conductor layer 5a or the fifth conductor layer 5ba and the sixth conductor layer 5bb included in the second conductor layer 5b may have different potentials or signals or may have the same potential or signal, and may be electrically connected to another part, such as an upper layer or a lower layer.

The second space 7c between the third conductor layer 5aa and the fourth conductor layer 5ab included in the first conductor layer 5a or the third space 7d between the fifth conductor layer 5ba and the sixth conductor layer 5bb included in the second conductor layer 5b may be, for example, at least 20 µm or at least 1% of one side of the substrate 2. When the third conductor layer 5aa and the fourth conductor layer 5ab included in the first conductor layer 5a or the fifth conductor layer 5ba and the sixth conductor layer 5bb included in the second conductor layer 5b are wide and flat wires serving as a ground potential or a power potential, the substrate may include an additional signal wire, such as a signal wire, in the second space 7c between the third conductor layer 5aa and the fourth conductor layer 5ab included in the first conductor layer 5a or the third space 7d between the fifth conductor layer 5ba and the sixth conductor layer 5bb included in the second conductor layer 5b.

The third conductor layer 5aa and the fourth conductor layer 5ab included in the first conductor layer 5a or the fifth conductor layer 5ba and the sixth conductor layer 5bb included in the second conductor layer 5b may be formed from the same material as the first conductor layer 5a and the second conductor layer 5b described in the first embodiment. The third conductor layer 5aa and the fourth conductor layer 5ab included in the first conductor layer 5a may be formed from different materials. Similarly, the fifth conductor layer 5ba and the sixth conductor layer 5bb included in the second conductor layer 5b may be formed from different materials.

The method for manufacturing the electronic component mounting board 1 shown in FIG. 12 is basically similar to the manufacturing method described in the fifth embodiment. The electronic component mounting board 1 may be manufactured by applying a metal paste to be the third conductor layer 5aa and the fourth conductor layer 5ab included in the first conductor layer 5a or the fifth conductor layer 5ba and the sixth conductor layer 5bb included in the second conductor layer 5b in one process or separate processes with a printing method predetermined for each layer.

The present invention is not limited to the examples described in the above embodiments. All the features including numerical values may be modified variously. For example, although the electrode pads 3 are quadrangular as viewed from above in the examples shown in FIG. 1A to FIG. 12, they may be circular or may be other polygons. In the embodiments, any number of electrodes 3 with any shapes may be in any arrangement, and the electronic component may be mounted with any method. Various combinations of the features of the embodiments are not limited to the above examples in the embodiments. The embodiments of the present invention may be combined in any manner unless any contradiction arises.

REFERENCE SIGNS LIST 1 electronic component mounting board
2 substrate
2a first layer
2b second layer
2c additional layer
2d recess
2e through-hole
3 electrode pad
4a first area
4b second area
5 metal layer
5a first conductor layer
5aa third conductor layer
5ab fourth conductor layer
5b second conductor layer
5ba fifth conductor layer
5bb sixth conductor layer
6 center
7 space
7a first end
7b second end
7c second space
7d third space
α1 first imaginary line
α2 second imaginary line
10 electronic component
12 lid
13 electronic component connection
14 lid bond
21 electronic device
22 electronic part
31 electronic module
32 housing

What is claimed is:

1. An electronic component mounting board, comprising:
a quadrangular substrate on which an electronic component is mountable, the substrate including a first layer, a second layer located at a lower surface of the first layer and a through hole penetrating the first layer and the second layer; and
a metal layer located between the first layer and the second layer, the metal layer including a first conductor layer, and a second conductor layer located with a space between the first conductor layer,
wherein the space between the first conductor layer and the second conductor layer extends from a first end of the metal layer to a second end of the metal layer different from the first end as viewed from above, and
wherein, as viewed from above, the through hole separates the space into a first space and a second space.

2. The electronic component mounting board according to claim 1, wherein
the metal layer overlaps a first imaginary line that is parallel to one side of the substrate and passes through a center of the substrate, and a second imaginary line that is perpendicular to the first imaginary line and passes through the center of the substrate as viewed from above.

3. The electronic component mounting board according to claim 1, wherein
the substrate includes a first area having a recess in which the electronic component is mountable, and a second area adjacent to the first area as viewed from above,
the first area or the second area includes the metal layer, and
the metal layer overlaps a first imaginary line that is parallel to one side of the substrate and passes through a center of the first area or the second area, and a second imaginary line that is perpendicular to the first imaginary line and passes through the center of the first area or the second area as viewed from above.

4. The electronic component mounting board according to claim 2, wherein
the first end and the second end in the space between the first conductor layer and the second conductor layer are away from the first imaginary line and the second imaginary line as viewed from above.

5. The electronic component mounting board according to claim 3, wherein
the first end and the second end in the space between the first conductor layer and the second conductor layer are away from the first imaginary line and the second imaginary line as viewed from above.

6. The electronic component mounting board according to claim 1, wherein
the first conductor layer and the second conductor layer are point symmetrical about an intersection between a first imaginary line that is parallel to one side of the substrate and passes through a center of the substrate and a second imaginary line that is perpendicular to the first imaginary line and passes through the center of the substrate as viewed from above.

7. The electronic component mounting board according claim 2, wherein
the first conductor layer and the second conductor layer are point symmetrical about an intersection between the first imaginary line and the second imaginary line as viewed from above.

8. The electronic component mounting board according claim 3, wherein
the first conductor layer and the second conductor layer are point symmetrical about an intersection between the first imaginary line and the second imaginary line as viewed from above.

9. The electronic component mounting board according claim 4, wherein
the first conductor layer and the second conductor layer are point symmetrical about an intersection between the first imaginary line and the second imaginary line as viewed from above.

10. The electronic component mounting board according claim 5, wherein
the first conductor layer and the second conductor layer are point symmetrical about an intersection between the first imaginary line and the second imaginary line as viewed from above.

11. The electronic component mounting board according claim 2, wherein
the first conductor layer and the second conductor layer are line symmetrical about the first imaginary line or the second imaginary line as viewed from above.

12. The electronic component mounting board according claim 3, wherein
the first conductor layer and the second conductor layer are line symmetrical about the first imaginary line or the second imaginary line as viewed from above.

13. The electronic component mounting board according claim 4, wherein
the first conductor layer and the second conductor layer are line symmetrical about the first imaginary line or the second imaginary line as viewed from above.

14. The electronic component mounting board according claim 5, wherein
the first conductor layer and the second conductor layer are line symmetrical about the first imaginary line or the second imaginary line as viewed from above.

15. The electronic component mounting board according claim 1, wherein, as viewed from above, the first space is located to the right and the second space is located to the left against at least one of a first imaginary line and a second imaginary line.

16. The electronic component mounting board according claim 2, wherein
the first conductor layer includes a third conductor layer, and a fourth conductor layer located with a space from the third conductor layer, and
the second conductor layer includes a fifth conductor layer, and a sixth conductor layer located with a space from the fifth conductor layer.

17. The electronic component mounting board according claim 3, wherein
the first conductor layer includes a third conductor layer, and a fourth conductor layer located with a space from the third conductor layer, and
the second conductor layer includes a fifth conductor layer, and a sixth conductor layer located with a space from the fifth conductor layer.

18. The electronic component mounting board according claim 16, wherein
the third conductor layer and the fifth conductor layer are point symmetrical about an intersection between the first imaginary line and the second imaginary line, and the fourth conductor layer and the sixth conductor layer are point symmetrical about the intersection between the first imaginary line and the second imaginary line as viewed from above.

19. An electronic device, comprising:
the electronic component mounting board according to claim 1; and
the electronic component mounted on the electronic component mounting board.

20. An electronic module, comprising:
the electronic device according to claim 19; and
a housing located on an upper surface of the electronic device or covering the electronic device.

* * * * *